(12) United States Patent
Lee et al.

(10) Patent No.: US 8,890,228 B2
(45) Date of Patent: Nov. 18, 2014

(54) SEMICONDUCTOR DEVICE AND METHOD OF MANUFACTURING THE SAME

(75) Inventors: Myoung-jae Lee, Suwon-si (KR); Young-soo Park, Yongin-si (KR); Chang-bum Lee, Seoul (KR); Seung-eon Ahn, Suwon-si (KR); Ki-hwan Kim, Anyang-si (KR); Bo-soo Kang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1149 days.

(21) Appl. No.: 12/292,596

(22) Filed: Nov. 21, 2008

(65) Prior Publication Data
US 2009/0243115 A1   Oct. 1, 2009

(30) Foreign Application Priority Data

Mar. 27, 2008  (KR) .................. 10-2008-0028496

(51) Int. Cl.
| | |
|---|---|
| H01L 29/76 | (2006.01) |
| H01L 23/498 | (2006.01) |
| G11C 5/02 | (2006.01) |
| G11C 5/04 | (2006.01) |
| G11C 5/06 | (2006.01) |
| H01L 23/48 | (2006.01) |
| H01L 25/18 | (2006.01) |

(52) U.S. Cl.
CPC ........... *H01L 23/49833* (2013.01); *G11C 5/02* (2013.01); *G11C 5/04* (2013.01); *G11C 5/063* (2013.01); *H01L 23/481* (2013.01); *H01L 25/18* (2013.01); *H01L 2225/06513* (2013.01); *H01L 2225/06517* (2013.01); *H01L 2225/0652* (2013.01); *H01L 2225/06572* (2013.01); *H01L 2924/0002* (2013.01)
USPC ........... 257/314; 257/315; 257/316; 257/317; 257/318; 257/319; 257/320

(58) Field of Classification Search
USPC ................................................ 257/314–320
See application file for complete search history.

(56) References Cited

U.S. PATENT DOCUMENTS

2005/0263809 A1* 12/2005 Natori et al. ................. 257/295
2007/0228383 A1* 10/2007 Bernstein et al. .............. 257/74

\* cited by examiner

*Primary Examiner* — Samuel Gebremariam
(74) *Attorney, Agent, or Firm* — Harness, Dickey & Pierce, P.L.C.

(57) ABSTRACT

Provided are a semiconductor device and a method of manufacturing the same. The semiconductor device includes: a memory array on a first substrate; and a peripheral circuit on a second substrate, wherein the first substrate and the second substrate may be attached to each other so that the memory array and the peripheral circuit are electrically connected to each other.

18 Claims, 19 Drawing Sheets

SEMICONDUCTOR DEVICE AND METHOD OF MANUFACTURING THE SAME

PRIORITY STATEMENT

This application claims priority under 35 U.S.C. §119 to Korean Patent Application No. 10-2008-0028496, filed on Mar. 27, 2008, in the Korean Intellectual Property Office, the entire contents of which are incorporated herein by reference.

BACKGROUND

1. Field

Example embodiments relate to a semiconductor device, and more particularly, to a semiconductor device including a memory array and a method of manufacturing the semiconductor device.

2. Description of Related Art

With increasing demands for more highly integrated and more cost-effective semiconductor devices, such as memory devices, extensive research and development efforts have been made to meet such demands. Research and development efforts have concentrated on reducing the size of a unit cell and a line width of a memory device and applying a material with good properties. Such efforts have, to a degree, allowed for an integration density of memory devices to increase while also reducing manufacturing costs per unit cell.

However, due to the resolution limitations of lithography, and due to a limitation of materials, it is difficult to reduce the size of the unit cell and the line width below threshold values.

SUMMARY

Example embodiments provide a semiconductor device with a stack memory array, and a peripheral circuit corresponding to the stack memory array, that may be provided on different substrates or different surfaces of a substrate, and a method of manufacturing the semiconductor device.

According to example embodiments, there is provided a semiconductor device comprising: a memory array on a first substrate; and a peripheral circuit on a second substrate, wherein the first substrate and the second substrate may be attached to each other so that the memory array and the peripheral circuit may be electrically connected to each other.

Any one of the first substrate and the second substrate may be one of a glass substrate, a hard plastic substrate, a flexible plastic substrate, a Si substrate, a GaAs substrate, and a SiN substrate.

The first substrate and the second substrate may be different sizes or shapes (a different footprint), different thicknesses, or different materials from each other.

A surface of the first substrate on which the memory array may be formed, and a surface of the second substrate on which the peripheral circuit may be formed, may face each other.

A top surface of one of the first substrate and the second substrate, and a bottom surface of the other of the first substrate and the second substrate, may face each other.

At least one first pad connected to the memory array may be on the first substrate, and at least one second pad connected to the peripheral circuit may be on the second substrate, wherein the first pad and the second pad may be electrically connected to each other.

The at least one first pad and the at least one second pad may be connected to each other by a conductive plug.

The at least one first pad and the at least one second pad may directly contact each other.

At least one via hole may pass through one of the first substrate and the second substrate, wherein the first pad and the second pad may be connected to each other by a conductive plug filled in the via hole.

An insulating layer may be between the first substrate and the second substrate, wherein the via hole and the conductive plug may pass through the insulating layer.

The second substrate on which the peripheral circuit may be formed, may be smaller in size than the first substrate.

The semiconductor device may further comprise at least one different memory array on at least one different substrate, wherein a part of the peripheral circuit may be electrically connected to the memory array on the first substrate, and the other part of the peripheral circuit may be electrically connected to the at least one different memory array.

The memory array may be on a first surface of the first substrate. The semiconductor device may further comprise another memory array on a second surface of the first substrate, which may be opposite to the first surface of the first substrate, wherein a part of the peripheral circuit may be electrically connected to the memory array on the first surface, and the other part of the peripheral circuit may be electrically connected to the other memory array on the second surface.

According to example embodiments, there may be provided a semiconductor device comprising: a memory array on a first surface of a substrate; and a peripheral circuit on a second surface of the substrate, which may be opposite to the first surface, and electrically connected to the memory array.

The substrate may be one of a glass substrate, a hard plastic substrate, a flexible plastic substrate, a Si substrate, a GaAs substrate, and a SiN substrate.

At least one first pad connected to the memory array may be on the first surface, and at least one second pad connected to the peripheral circuit may be on the second surface, wherein at lease one via hole passes through the substrate, and the first pad and the second pad may be connected to each other by a conductive plug filled in the via holes.

The size of the peripheral circuit may be less than that of the memory array.

The semiconductor device may further comprise at least one different memory array on at least one different substrate, wherein a part of the peripheral circuit may be electrically connected to the memory array on the first surface, and the other part of the peripheral circuit may be electrically connected to the at least one different memory array. "Different memory array" can mean a different size, a different thickness, or a different structure as later defined herein. "Different substrate" may mean a different size and shape (a different footprint), a different thickness, or a different material, as compared to another substrate.

According to example embodiments, there may be provided a method of manufacturing a semiconductor device, the method comprising: forming a memory array on a first substrate; forming a peripheral circuit on a second substrate; and electrically connecting the memory array and the peripheral circuit.

Any one of the first substrate and the second substrate may be one of a glass substrate, a hard plastic substrate, a flexible plastic substrate, a Si substrate, a GaAs substrate, and a SiN substrate.

The method may further comprise: forming at least one first pad on the first substrate so as to be electrically connected to the memory array; forming at least one second pad on the second substrate so as to be electrically connected to the peripheral circuit; and electrically connecting the first pad with the second pad.

The method may further comprise: forming at least one conductive plug on the at least one first pad; and attaching the first substrate to the second substrate so that the conductive plug and the second pad may contact each other.

The method may further comprise attaching the first substrate to the second substrate so that the first pad and the second pad may directly contact each other.

The method may further comprise: attaching the second substrate to the first substrate so that the first pad and the second pad correspond to each other; forming at least one via hole that may pass through an upper one of the first substrate and the second substrate, and the pad may be formed on the upper one of the first and second substrate; and filling a conductive plug in the via hole; wherein the first pad and the second pad may be connected to each other by the conductive plug.

The method may further comprise forming an insulating layer between the first substrate and the second substrate, wherein the via hole and the conductive plug may be formed to pass through the insulating layer.

According to example embodiments, there may be provided a method of manufacturing a semiconductor device, the method comprising: forming a memory array on a first surface of a substrate; and forming a peripheral circuit, which may be electrically connected to the memory array, on a second surface of the substrate, which may be opposite to the first surface of the substrate.

The substrate may be one of a glass substrate, a hard plastic substrate, a flexible plastic substrate, a Si substrate, a GaAs substrate, and a SiN substrate.

The method may further comprise: forming at least one first pad on the first surface so as to be electrically connected to the memory array; forming at least one second pad on the second surface so as to be electrically connected to the peripheral circuit; forming at least one via hole passing through any one of the first pad and the second pad and the substrate; and filling at least one conductive plug in the at least one via hole, wherein the first pad and the second pad may be connected to each other by the conductive plug.

Some of the operations of manufacturing the memory array and some of operations of manufacturing the peripheral circuit may be performed at the same time.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
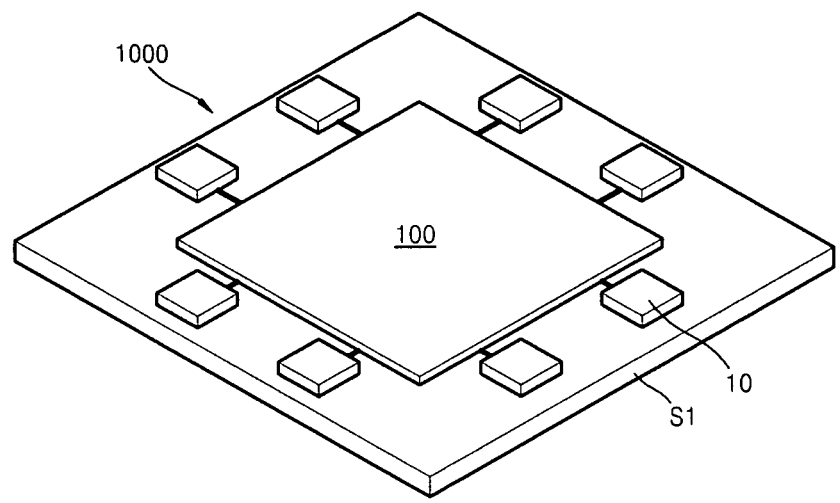
FIGS. 1 and 2 are perspective views illustrating first and second structure elements of a semiconductor device, according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a perspective view illustrating a first structure element 1000 of a semiconductor device, according to example embodiments.

Referring to FIG. 1, the first structure element 1000 may include a first memory array 100 disposed on a first substrate S1, and may further include one or more first pads 10 connected to the first memory array 100. The first substrate S1 may be a non-silicon substrate, such as a glass substrate, a hard plastic substrate, or a flexible plastic substrate, although example embodiments are not limited thereto. The first substrate S1 may be one of a Si substrate, a GaAs substrate, a SiN substrate, and other substrates. The first memory array 100 may have a configuration that is not based on silicon, as the first memory array 100 may be manufactured without a high temperature process that may be a high-density stacked structure. For example, if the first memory array 100 is a multi-layer cross point resistive memory array with a 1 diode (D)-1 resistor (R) cell structure, the 1D-1R cell structure may be a stacked structure, and each diode and each resistor may be formed of an oxide. In detail, the diode may have a structure in which a p-type oxide layer, such as a CuO layer or a NiO layer, and an n-type oxide layer, such as an InZnO layer or a $TiO_2$ layer; may be sequentially stacked. The resistor may be formed of a material having reversible resistive switching characteristics, such as a Ni oxide, a Cu oxide, a Ti oxide, a Co oxide, a Hf oxide, a Zr oxide, a Zn oxide, a W oxide, a Nb oxide, a TiNi oxide, a LiNi oxide, an Al oxide (AlO), an InZn oxide, a V oxide, a SrZr oxide, a SrTi oxide, a Cr oxide, an Fe oxide, a Ta oxide, or PCMO, or a material with non-reversible resistive switching characteristics, such as a Si oxide, an Al oxide ($Al_2O_3$), or a Si nitride. Accordingly, in example embodiments, the first memory array 100 may be easily manufactured at a low temperature on a non-silicon substrate such as a glass or plastic substrate. A non-silicon substrate, such as a glass or plastic substrate, may be less expensive than a Si substrate. Also, the multi-layer cross point resistive memory array may have a very high cell density. In addition, in the multi-layer cross point resistive memory array, the diode may be a PN diode, a Schottky diode, a tunnel diode, a varactor diode, or a Zener diode, and may be replaced by a threshold switching device or the like. The first memory array 100 may not be limited to the multi-layer cross point resistive memory array, and thus, the first memory array 100 may have any one of the structures of a dynamic random access memory (DRAM), a static random access memory (SRAM), a read only memory (ROM), a ferroelectric random access memory (FRAM), a magnetic random access memory (MRAM), a phase-change random access memory (PRAM), a flash memory, and the like. The number and positions of the first pads 10 may be changed in various ways, as compared to the number and positions shown.

Figure 2:
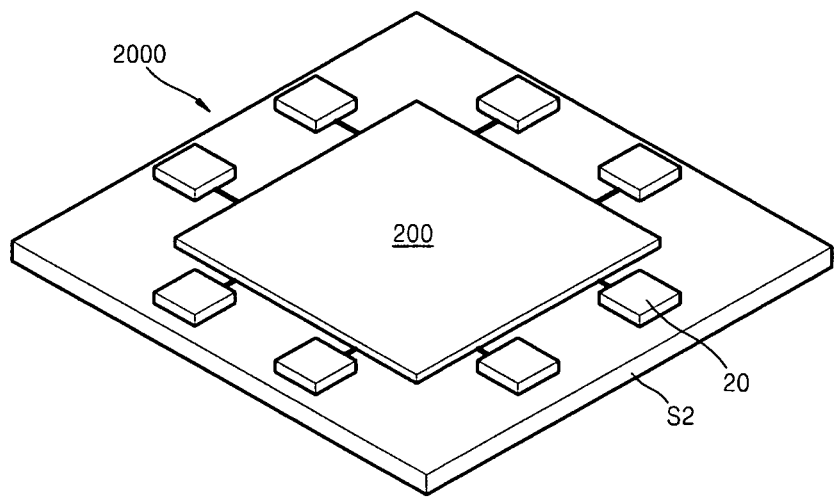

FIG. 2 is a perspective view illustrating a second structure element 2000 of the semiconductor device, according to example embodiments.

Referring to FIG. 2, the second structure element 2000 may include a peripheral circuit 200 disposed on a second substrate S2. The second substrate S2 may be a semiconductor substrate, such as a Si substrate, although example embodiments are not limited thereto. For example, the second substrate S2 may be one of a GaAs substrate, a SiN substrate, a glass substrate, a hard plastic substrate, and a flexible plastic substrate. The peripheral circuit 200 may include at least one of a sense amplifier, a decoder, a driving device, a voltage generator, and other circuits, which may be used in a general memory device. The peripheral circuit 200 may basically include a high performance complementary metal-oxide semiconductor (CMOS) device. In example embodiments, the peripheral circuit 200 may be formed on a Si substrate on which the CMOS device may be easily manufactured. The second structure element 2000 may further include one or more second pads 20 connected to the peripheral circuit 200. The number and positions of the second pads 20 may be changed in various ways, as compared to the second pads 20 shown.

Figure 3:
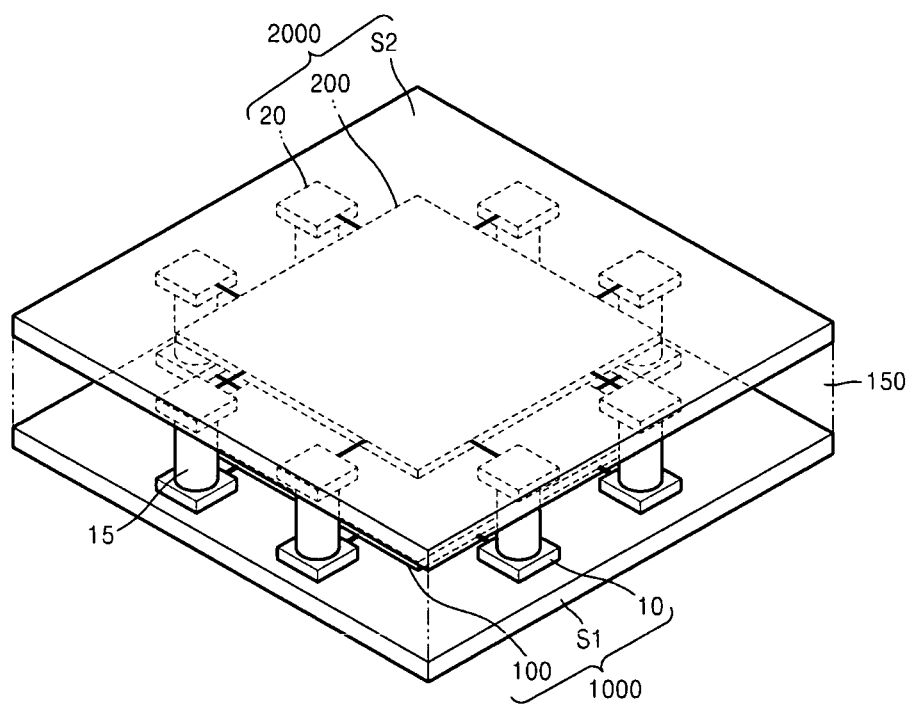
FIGS. 3 through 9 are perspective views of semiconductor devices according to example embodiments.

FIG. 3 is a perspective view of a semiconductor device obtained by coupling the first structure element 1000 of FIG. 1 and the second structure element 2000 of FIG. 2, according to example embodiments.

Referring to FIG. 3, the first memory array 100 and the peripheral circuit 200 may face each other, and first conductive plugs 15 may be respectively disposed between the first pads 10 and the second pads 20 to connect the first pads 10 and the second pads 20 to each other, thereby electrically connecting the first memory array 100 and the peripheral circuit 200 to each other. A first insulating layer 150 around the first conductive plugs 15 may be disposed between the first substrate S1 and the second substrate S2.

Figure 4:
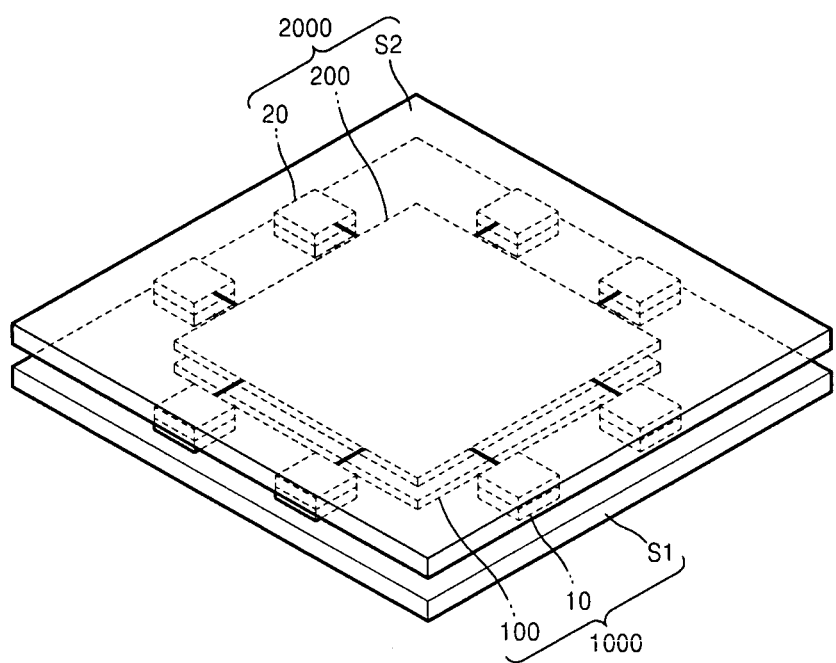

FIG. 4 is a perspective view of a semiconductor device obtained by coupling the first structure element 1000 of FIG. 1 and the second structure element 2000 of FIG. 2, according to example embodiments.

Referring to FIG. 4, the second substrate S2 may be disposed on the first substrate S1 so that the first pads 10 and the second pads 20 may directly contact each other. In example embodiments, the first pads 10 may protrude slightly over the first memory array 100 in a direction perpendicular to a top surface of the first substrate S1. Likewise, the second pads 20 may protrude slightly over the peripheral substrate 200 in a direction perpendicular to a top surface of the second substrate S2. Hence, the first memory array 100 and the peripheral circuit 200 may not contact each other. The first memory array 100 and/or the peripheral circuit 200 may comprise an insulating layer (not shown) thereon, and in such a case, the first memory array 100 and the peripheral circuit 200 may contact each other. Although not shown, an empty space between the first substrate S1 and the second substrate S2 may be filled with an insulating material.

Figure 5:
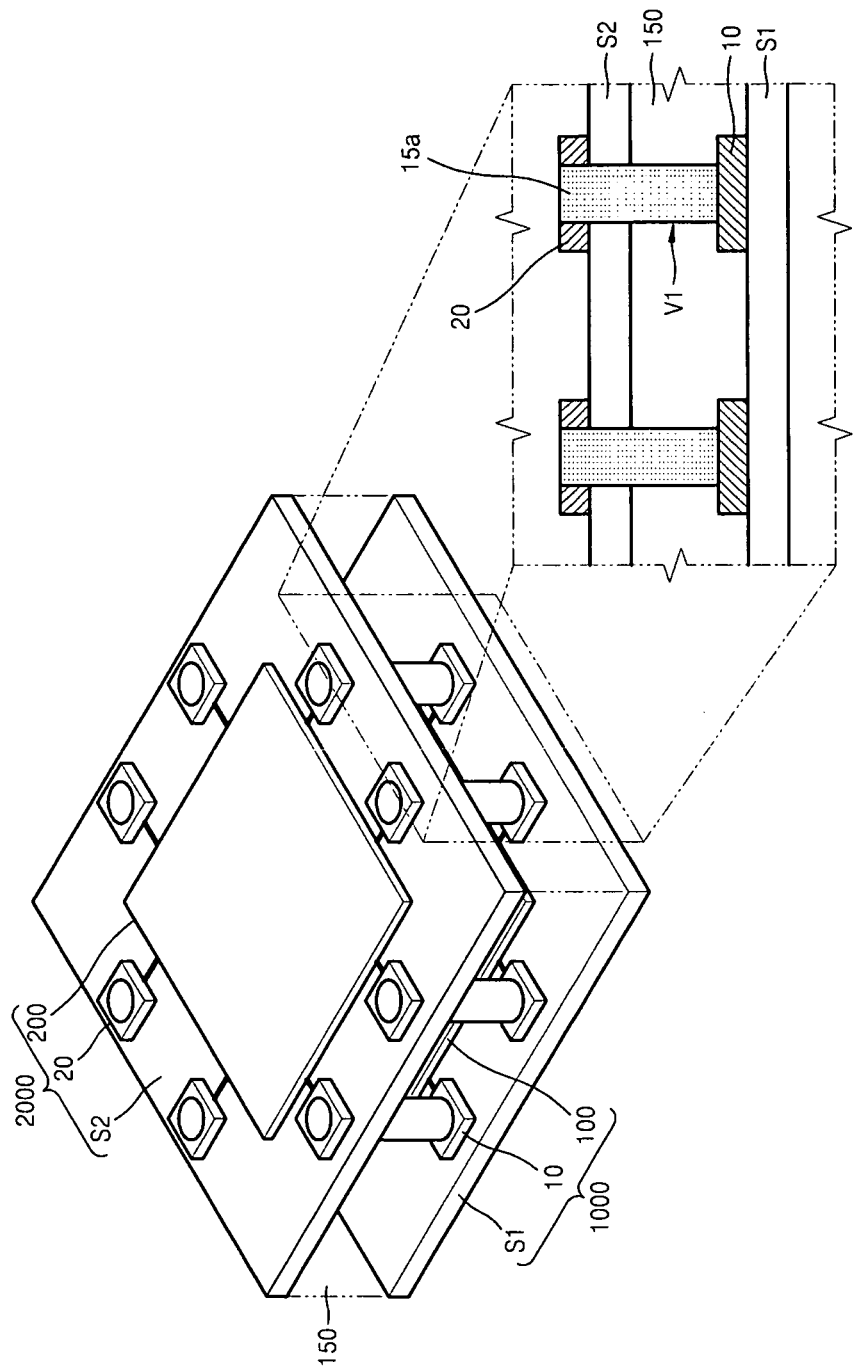

FIG. 5 is a perspective view and a partially enlarged cross-sectional view of a semiconductor device obtained by coupling the first structure element 1000 of FIG. 1 and the second structure element 2000 of FIG. 2, according to example embodiments.

Referring to FIG. 5, the second substrate S2 may be disposed over the first substrate S1 in such a manner that a top surface of the first substrate S1 faces a bottom surface of the second substrate S2. The first memory array 100 may be formed on the top surface of the first substrate S1, and the peripheral circuit 200 may be formed on the top surface of the second substrate S2. A first insulating layer 150 may be disposed between the first substrate S1 and the second substrate S2. Via holes V1 may be formed, respectively, through the second pads 20, the second substrate S2 under the second pads 20, and the first insulating layer 150, thus exposing the first pads 10. First conductive plugs 15a may be respectively disposed in the via holes V1. Accordingly, the first pads 10 and the second pads 20 may be connected to each other via the first conductive plugs 15a. In example embodiments, the second substrate S2 in which the via holes V1 may be formed may be thin, for example, hundreds of μm thick. If necessary, the second substrate S2 may directly contact the first substrate S1, without the first insulating layer 150 in between, the positions of the first substrate S1 and the second substrate S2 may be reversed, and the via holes V1 may be formed in the first substrate S1 instead of the second substrate S2.

Figure 6:
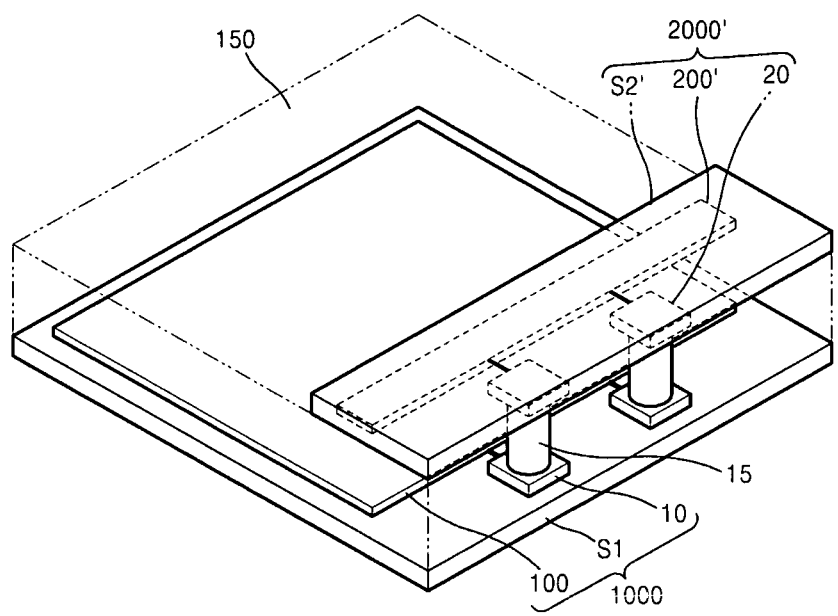
Figure 7:
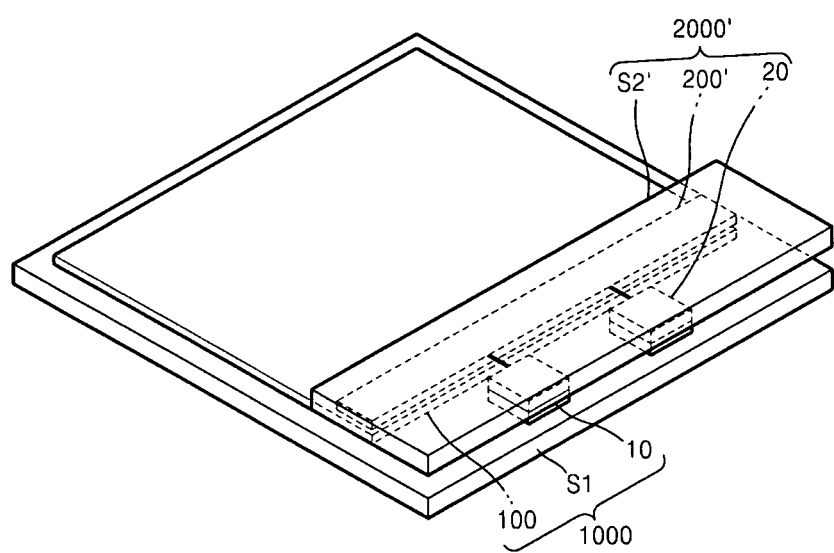
Figure 8:
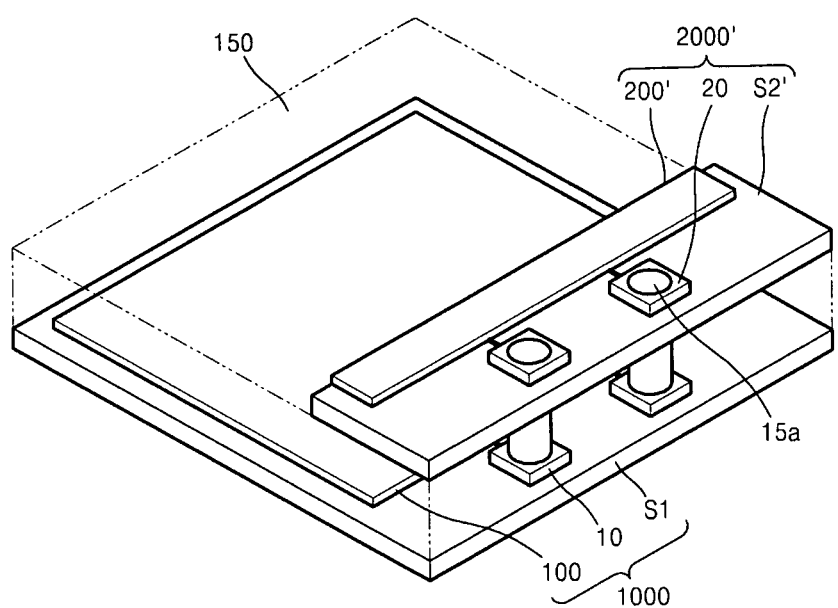

The size of each of the peripheral circuit 200 and the second substrate S2, shown in FIGS. 3 through 5, may be changed. For example, the size of the peripheral circuit 200 may be less than that of the first memory array 100, and the size of the second substrate S2 may be less than that of the first substrate S1, as shown in the semiconductor devices of FIGS. 6 through 8. In FIGS. 6 through 8, the reference numerals S2', 200', and 2000' denote a second substrate, a peripheral circuit, and a second structure element, respectively. Except for the size of each of the second substrate S2' and the peripheral circuit 200', and the number of first and second pads 10 and 20, the semiconductor devices of FIGS. 6 through 8 are the same as the semiconductor devices of FIGS. 3 through 5.

Each of the semiconductor devices of FIGS. 3 through 8 may further include a second memory array 300 disposed on a third substrate, and the second memory array 300 may be electrically connected to the peripheral circuit 200. An example thereof is shown in FIG. 9.

Figure 9:
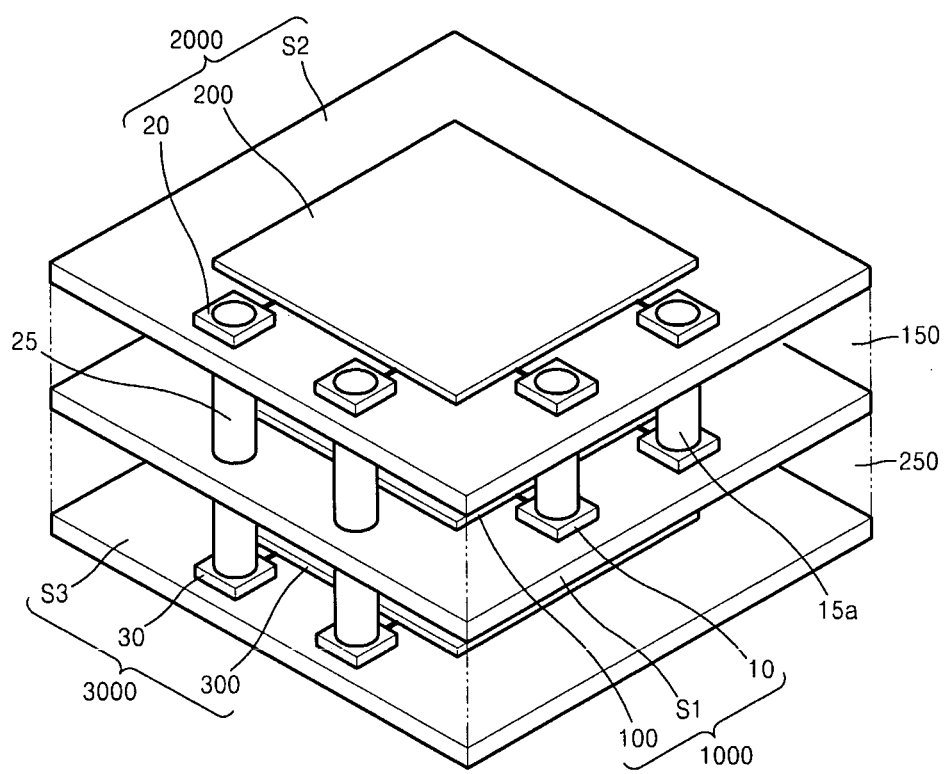

Referring to FIG. 9, the first structure element 1000, the second structure element 2000, and the coupling relationship between the first structure element 1000 and the second structure element 2000 are similar to that of FIG. 5. However, some of the second pads 20 of FIG. 9 are connected to the first pads 10. A third substrate S3 may be disposed below the first substrate S1. A second insulating layer 250 may be disposed between the first substrate S1 and the third substrate S3. A second memory array 300 may be disposed on the third substrate S3, and one or more third pads 30 connected to the second memory array 300 may be further disposed on the third substrate S3. The third substrate S3, the second memory array 300, and the third pads 300 may constitute a third structure element 3000. The third substrate S3 may be one of a glass substrate, a hard plastic substrate, a flexible plastic substrate, a Si substrate, a GaAs substrate, a SiN substrate, and other substrates. The second memory array 300 may have a structure different from that of the first memory array 100. For example, the second memory array 300 may have any one of the structures of a NAND flash, a NOR flash, a SRAM, a DRAM, a ROM, and a non-volatile memory. Second conductive plugs 25 may be disposed to pass through the second pads 20, which may be connected to the first pads 10, the second conductive plug 25 running through the second substrate S2, the second pads 20, the first insulating layer 150, the first substrate S1, the second insulating layer 250, and contacting the third pads 30. Accordingly, the third pads 30 may be connected to the second pads 20 via the second conductive plugs 25, such that the second memory array 300 and the peripheral circuit 200 may be electrically connected to each other via the second pads 20, the third pads 30, and the second conductive plugs 25 disposed between the second pads 20 and the third pads 30. Hence, a part of the peripheral circuit 200 may be connected to the first memory array 100, and the other part of the peripheral circuit 200 may be connected to the second memory array 300. The positions of the first through third structure elements 1000, 2000, and 3000 may be reversed.

Although not shown, the semiconductor device of FIG. 9 may further include at least one different memory array disposed on at least one different substrate. In example embodiments, the at least one different memory array may be electrically connected to the peripheral circuit 200.

The first memory array 100 and the second memory array 300 may be disposed on a top surface and a bottom surface of the first substrate S1, respectively. The first substrate S1 may be attached to the second substrate S2 on which the peripheral circuit 200 may be disposed. In example embodiments, a part of the peripheral circuit 200 may be connected to the first memory array 100 and the other part of the peripheral circuit 200 may be connected to the second memory array 300.

Figure 10:
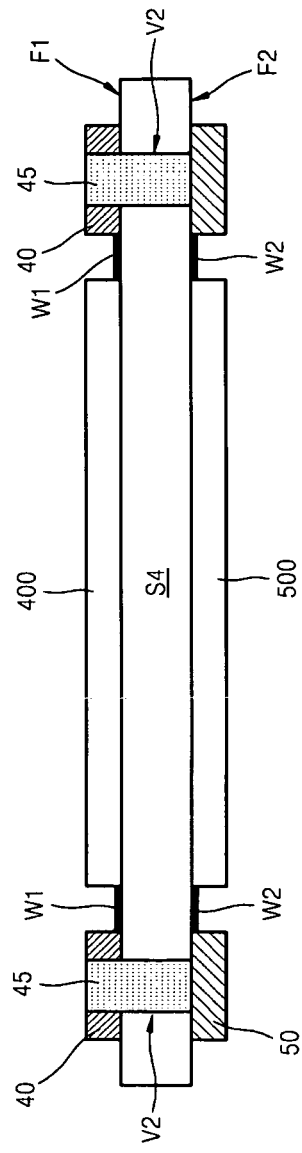
FIGS. 10 and 11 are cross-sectional views of semiconductor devices, according to example embodiments.
Figure 11:
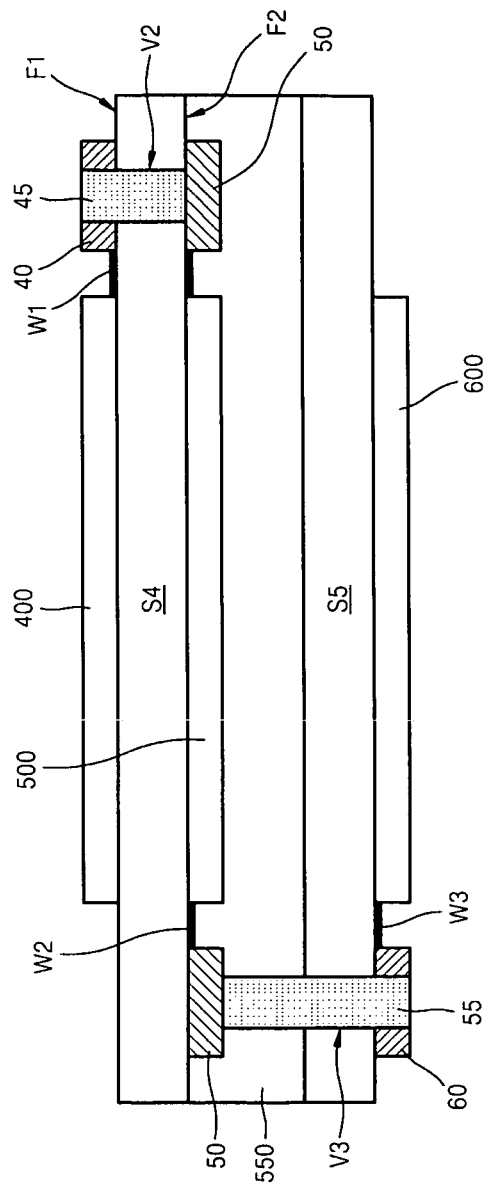

In addition, the semiconductor devices of FIGS. 3, 4, and 6 through 8 may be modified to include three or more substrates, or at least two of the semiconductor devices of FIGS. 3 through 8 and semiconductor devices of FIGS. 10 and 11 may be combined.

FIG. 10 is a cross-sectional view of a semiconductor device according to example embodiments.

Referring to FIG. 10, a fourth memory array 400 may be disposed on a first surface F1 of a fourth substrate S4, and one or more fourth pads 40 may be connected to the fourth memory array 400 via a wire W1, where the fourth pads 40 may be further disposed on the first surface F1 of the fourth substrate S4. A peripheral circuit 500 may be disposed on a second surface F2 of the fourth substrate S4, and one or more fifth pads 50 may be connected to the peripheral circuit 500 via a wire W2, where the fifth pads 50 may be further disposed on the second surface F2 of the fourth substrate S4. The fourth substrate S4 may be one of a glass substrate, a hard plastic substrate, a flexible plastic substrate, a Si substrate, a GaAs substrate, and a SiN substrate. The first and second surfaces F1 and F2 may be opposite surfaces, that is, a top surface and a bottom surface of the fourth substrate S4, respectively. The fourth pads 40 and the fifth pads 50 may be electrically connected to each other via third conductive plugs 45 disposed in via holes V2 that pass through the fourth substrate S4. The via holes V2 may be formed to pass through one of the fourth pads 40 and the fifth pads 50, for example, in example embodiments, the fourth pads 40. Although not shown, a protective layer covering the fourth memory array 400 and the fourth pads 40 may be further disposed on the first surface F1. Likewise, another protective layer covering the peripheral circuit 500 and the fifth pads 50 may be further disposed on the second surface F2.

Although the size of the fourth memory array 400 and the size of the peripheral circuit 500 may be similar to each other, as shown in FIG. 10, the size of the peripheral circuit 500 may be less than that of the fourth memory array 400.

The semiconductor device of FIG. 10 may further include at least one different memory array disposed on at least one different substrate, as shown in FIG. 11.

Referring to FIG. 11, a fifth substrate S5 may be disposed below the fourth substrate S4. A fifth memory array 600 may be disposed on a bottom surface of the fifth substrate S5, and one or more sixth pads 60, connected to the fifth memory array 600 via a wire W3, may be further disposed on the bottom surface of the fifth substrate S5. A third insulating layer 550 may be disposed between the fourth substrate S4 and the fifth substrate S5. Fourth conductive plugs 55 may be disposed in via holes V3 that pass through the sixth pads 60, the fifth substrate S5, and the third insulating layer 550. Accordingly, the fifth pads 50 and the sixth pads 60 may be electrically connected to each other via the fourth conductive plugs 55. A part of the peripheral circuit 500 may be connected to the fourth memory array 400, and the other part of the peripheral circuit 500 may be connected to the fifth memory array 600. If the fifth substrate S5 is turned upside down so that the fifth memory array 600 and the peripheral circuit 500 face each other, conductive plugs may be disposed between the fifth pads 50 and the sixth pads 60 to connect the fifth pads 50 and the sixth pads 60, or the fifth pads 50 and the sixth pads 60 may directly contact each other without the use of conductive plugs. Additionally, the position of the peripheral circuit 500 and the fifth memory array 600 may be switched such that the fourth memory array 400 and the fifth memory array 600 are both located on the fourth substrate S4.

Figure 12A:
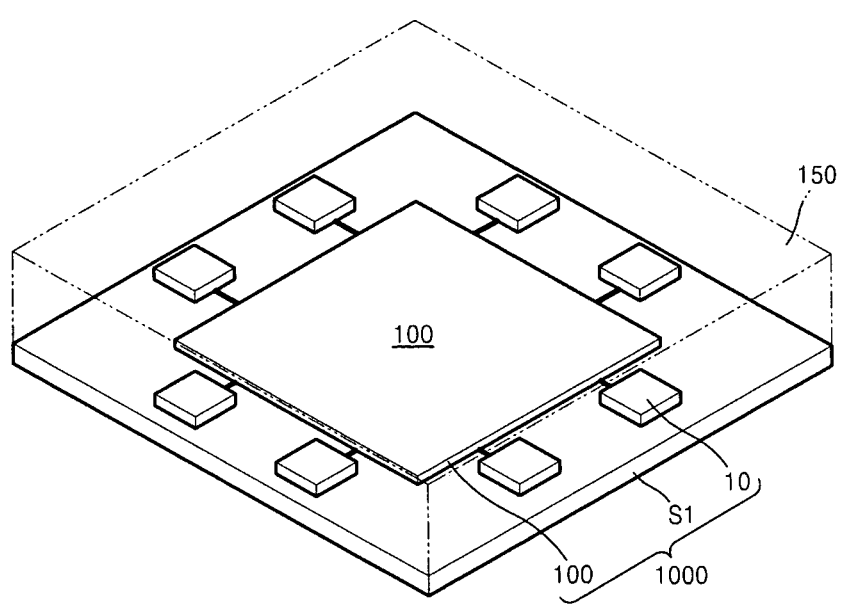
FIGS. 12A through 12C are perspective views illustrating a method of manufacturing a semiconductor device, according to example embodiments.
Figure 12B:
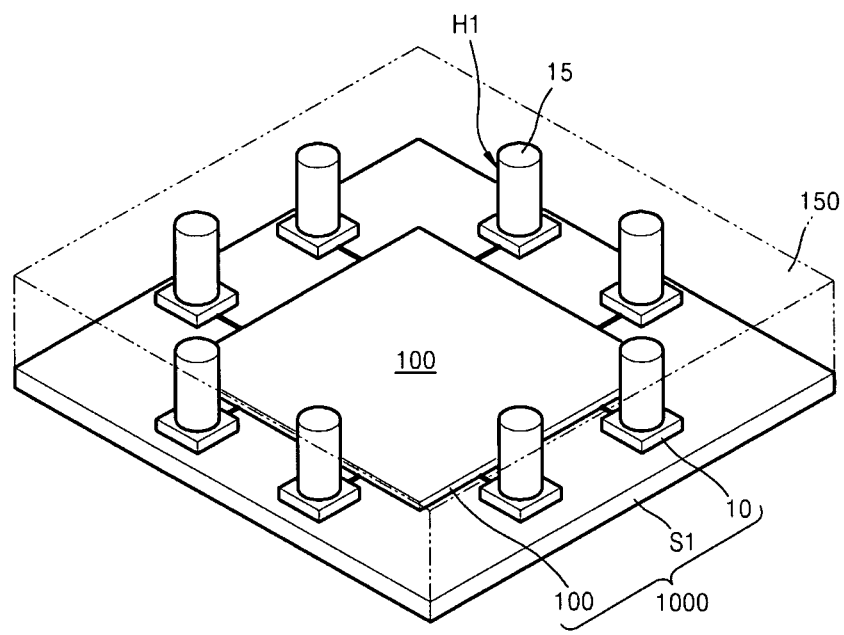
Figure 12C:
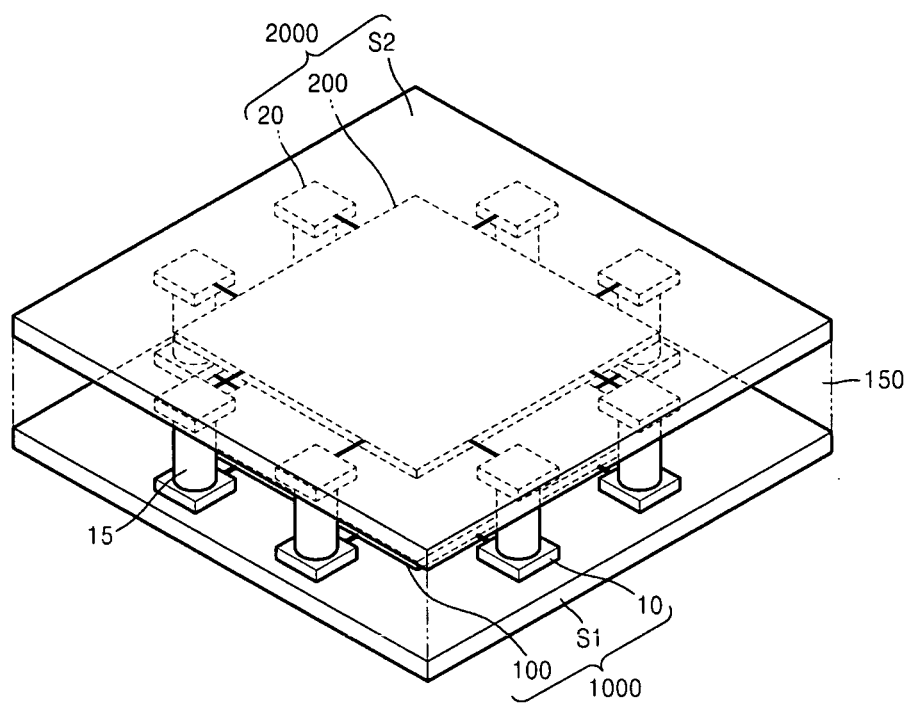

FIGS. 12A through 12C are perspective views illustrating a method of manufacturing a semiconductor device, according to example embodiments.

Referring to FIG. 12A, a first memory array 100 and one or more first pads 10 connected to the first memory array 100 may be formed on a first substrate S1. The first substrate S1, the first memory array 100, and the first pads 10 constitute a first structure element 1000. Next, a first insulating layer 150 covering the first memory array 100 and the first pads 10 may be formed on the first substrate S1.

Referring to FIG. 12B, the first insulating layer 150 may be etched to form contact holes H1 exposing the first pads 10, and first conductive plugs 15 may be formed in the contact holes H1.

Referring to FIG. 12C, a peripheral circuit 200 and one or more second pads 20 connected to the peripheral circuit 200 may be formed on a second substrate S2. The peripheral circuit 200, the second pads 20, and the second substrate S2 constitute a second structure element 2000. The second structure element 2000 may be attached to the first insulating layer 150 so that the first conductive plugs 15 and the second pads 20 may contact each other.

The semiconductor device of FIG. 3 may be manufactured by the method of FIGS. 12A through 12C. The semiconductor device of FIG. 4 may be manufactured by directly contacting the first structure element 1000 with the second structure element 2000.

Figure 13A:
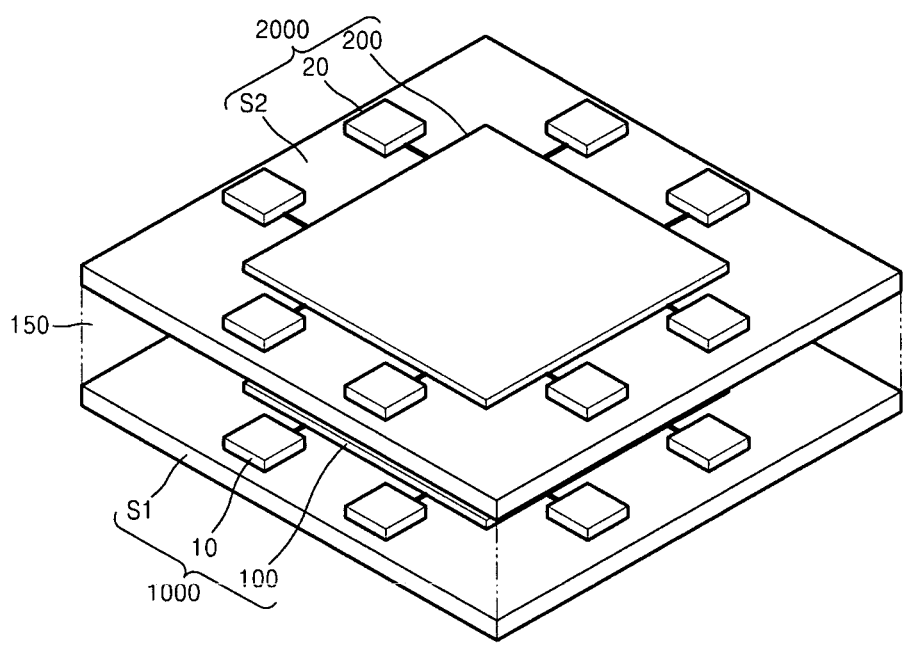
FIGS. 13A through 13C are perspective views illustrating a method of manufacturing a semiconductor device, according to example embodiments.
Figure 13B:
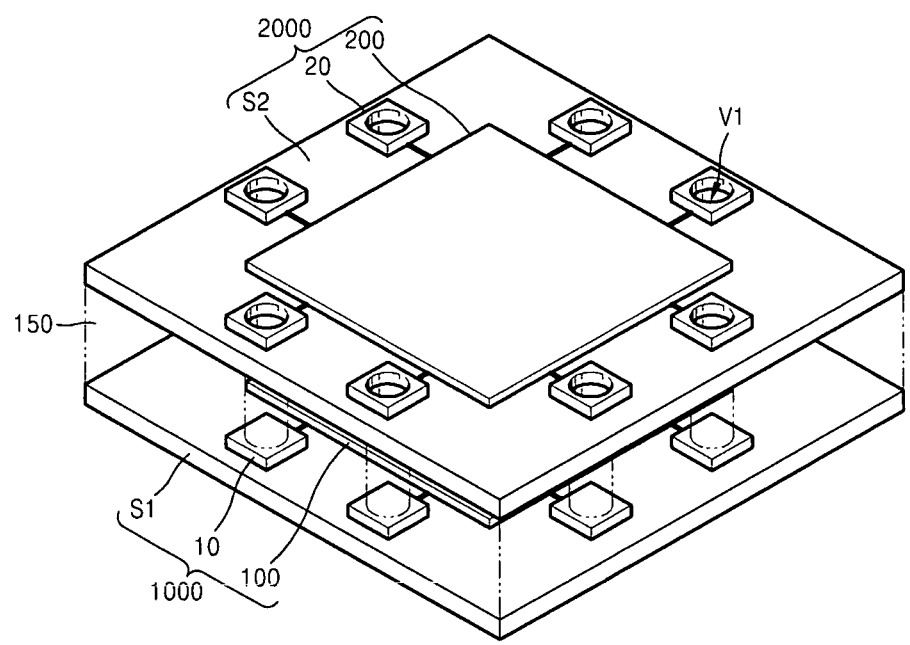
Figure 13C:
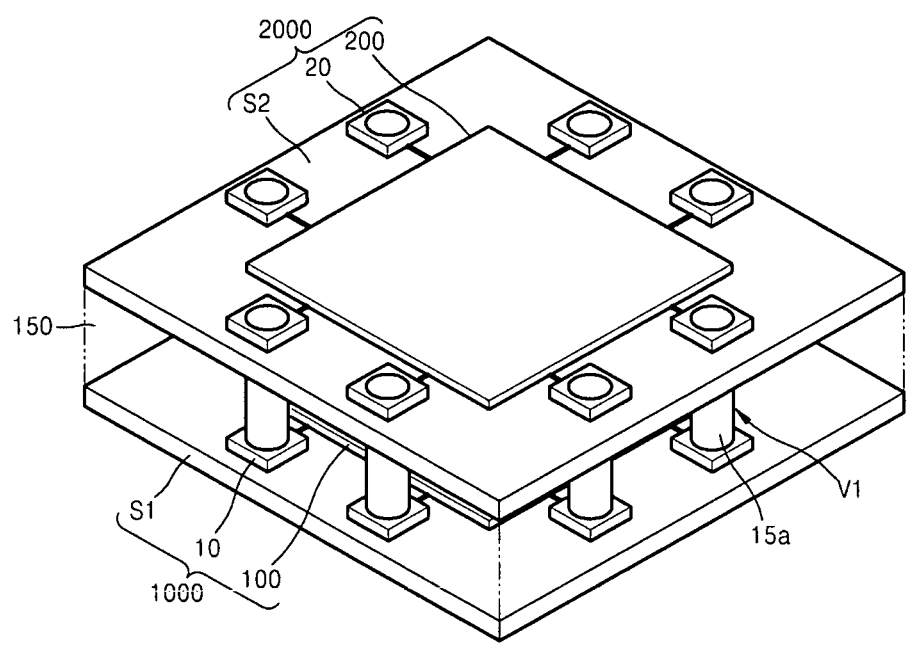

FIGS. 13A through 13C are perspective views illustrating a method of manufacturing a semiconductor device, according to example embodiments. The semiconductor device of FIG. 5 may be manufactured by the method of FIGS. 13A through 13C.

Referring to FIG. 13A, a first structure element 1000 may be prepared, and a first insulating layer 150 covering a first memory array 100 and first pads 10 may be formed on a first substrate S1. Next, a second structure element 2000 may be attached to the first insulating layer 150 in such a manner that a bottom surface of the second substrate S2 may be attached to a top surface of the first insulating layer 150.

Referring to FIG. 13B, second pads 20, a second substrate S2 under the second pads 20, and the first insulating layer 150 may be etched to form via holes V1 exposing the first pads 10.

Referring to FIG. 13C, first conductive plugs 15a may be formed in the via holes V1. The first conductive plugs 15a may be in contact with the first pads 10 and the second pads 20.

The semiconductor device of FIG. 5 may be manufactured by the method of FIGS. 13A through 13C, and the semiconductor device of FIG. 9 may also be manufactured by the method of FIGS. 13A through 13C.

Figure 14A:
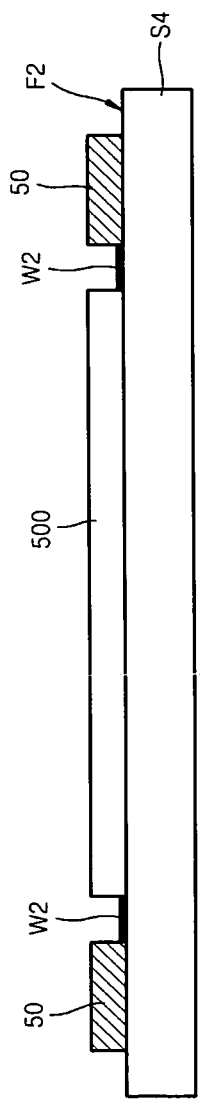
FIGS. 14A through 14C are cross-sectional views illustrating a method of manufacturing a semiconductor device, according to example embodiments.
Figure 14B:
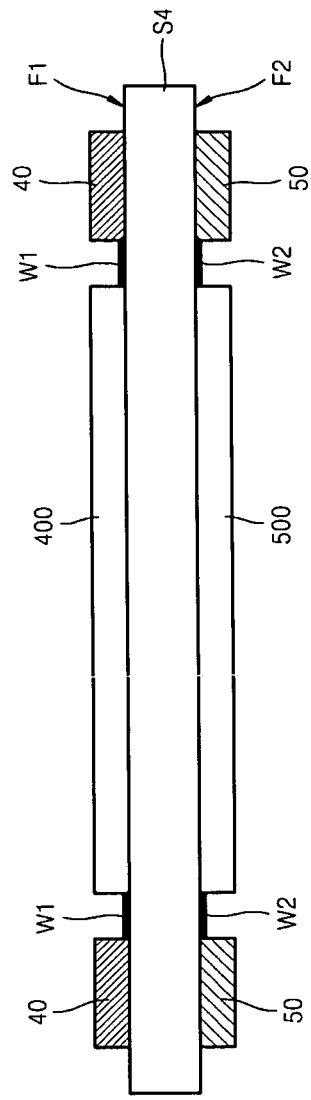
Figure 14C:
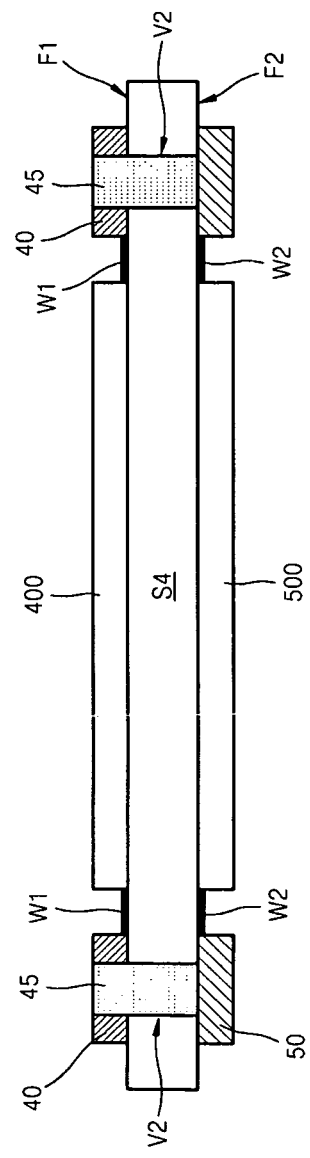

FIGS. 14A through 14C are cross-sectional views illustrating a method of manufacturing a semiconductor device according to example embodiments. The semiconductor device of FIG. 10 may be manufactured by the method of FIGS. 14A through 14C.

Referring to FIG. 14A, a peripheral circuit 500 and one or more fifth pads 50 connected to the peripheral circuit 500 may be formed on a second surface F2 of a fourth substrate S4 such that a wire W2 connects the peripheral circuit 500 with the fifth pad 50.

As shown in FIG. 14B, on the side opposite of the peripheral circuit 500 of the fourth substrate S4 a fourth memory array 400 and one or more fourth pads 40 connected to the fourth memory array 400 may be formed on a first surface F1 of the fourth substrate S4 such that a wire W1 connects the fourth memory array 400 with the fourth pad 40. The fourth pads 40 may be disposed to respectively correspond to the fifth pads 50. When the fourth substrate S4 is a transparent substrate, such as a glass substrate, the alignment positions of the fourth pads 40 and the fourth memory array 400 may be determined by an optical method. For example, if the fourth substrate S4 is a transparent substrate and an alignment key (not shown) is formed on the second surface F2 in the operation depicted in FIG. 14A, the forming positions of the fourth pads 40 and the fourth memory array 400 may be determined by monitoring the position of the alignment key by means of a microscope, in the operation depicted in FIG. 14B. In the operation of FIG. 14A, if the fourth substrate S4 is a non-transparent substrate, the coordinates of the fifth pads 50 may be determined, the fourth substrate S4 may then be turned upside down, and the placement of the fifth pads 40 may be determined on the basis of the coordinates of the fifth pads 50. Before the operation of FIG. 14B, a protective layer (not shown) covering the peripheral circuit 500 and the fifth pads 50 may be formed on the second surface F2. In example embodiments, when the fourth memory array 400 and the fourth pads 40 may be formed in the operation of FIG. 14B, the protective layer may protect the peripheral circuit 500 and the fifth pads 50 from damage. The protective layer may be removed later. The protective layer may be formed of a resin that is often used in manufacturing a semiconductor device.

Referring to FIG. 14C, the fourth pads 40 and the fourth substrate S4 disposed under the fourth pads 40 may be etched to form via holes V2 exposing the fifth pads 50. Next, third conductive plugs 45 may be respectively formed in the via holes V2. The fourth pads 40 and the fifth pads 50 may be connected to each other by the third conductive plugs 45, and thus, the fourth memory array 400 and the peripheral circuit 500 may be connected to each other.

Although the fourth memory array 400 may be formed after the peripheral circuit 500 is formed in FIGS. 14A through 14C, example embodiments are not limited thereto. For example, the fourth memory array 400 may be first formed and then the peripheral circuit 500 may be formed. Also, some of the operations of manufacturing the fourth memory array 400 and some of the operations of manufacturing the peripheral circuit 500 may be performed at the same time. That is, a predetermined layer may be simultaneously deposited on the first surface F1 and the second surface F2.

At least two of the method of FIGS. 12A through 12C, the method of FIGS. 13A through 13C, the method of FIGS. 14A through 14C, and the method of manufacturing the semiconductor device of FIG. 4 may be combined, and a semiconductor device including at least two different memory arrays disposed on at least two different substrates and at least one peripheral circuit disposed on at least one substrate may be manufactured.

As described above, according to example embodiments, highly integrated and cost-effective memory devices may be manufactured. In particular, when a substrate on which a memory array may be formed is an inexpensive glass substrate or plastic substrate, and the size of a substrate on which a peripheral circuit may be formed is less than that of the substrate on which the memory array is formed, manufacturing costs of the memory device may be reduced. Also, when at least three substrates are used and memory arrays are formed on at least two substrates, the integration density of the memory device may be easily increased.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of manufacturing a semiconductor device, the method comprising:
   forming a first memory array on a first substrate;
   forming a peripheral circuit on a second substrate;

wherein the peripheral circuit is for the first memory array, and no memory array is provided on the second substrate; and electrically connecting the first memory array and the peripheral circuit, wherein a surface of the first substrate on which the memory array is formed and a surface of the second substrate on which the peripheral circuit is formed face each other.

2. The method of claim 1, wherein any one of the first substrate and the second substrate is one selected from the group consisting of a glass substrate, a hard plastic substrate, a flexible plastic substrate, a Si substrate, a GaAs substrate, and a SiN substrate.

3. The method of claim 1, further comprising:
forming at least one first pad on the first substrate, the at least one first pad electrically connected to the first memory array;
foaming at least one second pad on the second substrate, the at least one second pad electrically connected to the peripheral circuit; and
electrically connecting the first pad with the second pad.

4. The method of claim 3, further comprising:
forming at least one conductive plug on the at least one first pad, the electrically connecting of the first pad with the second pad accomplished by the at least one conductive plug.

5. The method of claim 3, further comprising:
attaching the first substrate to the second substrate so that the first pad and the second pad directly contact each other.

6. The method of claim 3, further comprising:
attaching the second substrate to the first substrate so that the first pad and the second pad align with each other;
forming at least one via hole passing through the first substrate, the second substrate, and at least one of the first pad and second pad; and
filling the via hole with a conductive plug;
wherein the first pad and the second pad are electrically connected to each other by the conductive plug.

7. The method of claim 6, further comprising:
forming an insulating layer between the first substrate and the second substrate,
wherein the via hole and the conductive plug are formed to pass through the insulating layer.

8. A semiconductor device comprising:
a first memory array on a first substrate; and
a peripheral circuit for the first memory array, the periphery circuit being on a second substrate, no memory array being on the second substrate, wherein
the first memory array and the peripheral circuit are electrically connected to each other, and
a surface of the first substrate on which the memory array is formed and a surface of the second substrate on which the peripheral circuit is formed face each other.

9. The semiconductor device of claim 8, wherein any one of the first substrate and the second substrate is one selected from the group consisting of a glass substrate, a hard plastic substrate, a flexible plastic substrate, a Si substrate, a GaAs substrate, and a SiN substrate.

10. The semiconductor device of claim 8, wherein the first substrate and the second substrate are one of a different size, shape, thickness, and material from each other.

11. The semiconductor device of claim 8, further comprising:
at least one first pad connected to the first memory array, the at least one first pad on the first substrate; and
at least one second pad connected to the peripheral circuit, the at least one second pad on the second substrate, wherein the first pad and the second pad are electrically connected to each other.

12. The semiconductor device of claim 11, wherein the at least one first pad and the at least one second pad are connected to each other by a conductive plug.

13. The semiconductor device of claim 11, wherein the at least one first pad and the at least one second pad directly contact each other.

14. The semiconductor device of claim 11, further comprising:
at least one via hole passing through one of the first substrate and the second substrate, wherein the first pad and the second pad are electrically connected to each other by a conductive plug filling the via hole.

15. The semiconductor device of claim 14, further comprising:
an insulating layer between the first substrate and the second substrate, wherein the via hole and the conductive plug pass through the insulating layer.

16. The semiconductor device of claim 8, wherein the second substrate is smaller in size than the first substrate.

17. The semiconductor device of claim 9, further comprising:
at least one different memory array on at least one different substrate,
wherein a part of the peripheral circuit is electrically connected to the first memory array, and the other part of the peripheral circuit is electrically connected to the at least one different memory array.

18. The semiconductor device of claim 8, wherein the first memory array is disposed on a first surface of the first substrate, the semiconductor device further comprising: a second memory array on a second surface of the first substrate, the second memory array located on a side of the first substrate that is opposite of the first memory array,
wherein a part of the peripheral circuit is electrically connected to the first memory array and another part of the peripheral circuit is electrically connected to the second memory array.

* * * * *